US006818476B2

(12) United States Patent
Yonemochi

(10) Patent No.: US 6,818,476 B2
(45) Date of Patent: Nov. 16, 2004

(54) INSERT-MOLDABLE HEAT SPREADER, SEMICONDUCTOR DEVICE USING SAME, AND METHOD FOR MANUFACTURING SUCH SEMICONDUCTOR DEVICE

(75) Inventor: Masahiro Yonemochi, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 159 days.

(21) Appl. No.: 10/079,864

(22) Filed: Feb. 21, 2002

(65) Prior Publication Data

US 2002/0119602 A1 Aug. 29, 2002

(30) Foreign Application Priority Data

Feb. 23, 2001 (JP) ........................................ 2001-048059

(51) Int. Cl.[7] .......................... H01L 21/42; H01L 21/48; H01L 21/50
(52) U.S. Cl. ....................................................... 438/122
(58) Field of Search ......................................... 438/122

(56) References Cited

U.S. PATENT DOCUMENTS 5,216,278 A    6/1993  Lin et al.
5,365,107 A  * 11/1994  Kuraishi et al. ............ 257/673
5,482,898 A  *  1/1996  Marrs .......................... 29/827
5,641,987 A  *  6/1997  Lee .............................. 257/675
5,977,626 A  * 11/1999  Wang et al. ................. 257/707
6,400,014 B1 *  6/2002  Huang et al. ................ 257/712
6,432,749 B1 *  8/2002  Libres ......................... 438/122
6,462,405 B1 * 10/2002  Lai et al. .................... 257/675
6,599,779 B2 *  7/2003  Shim et al. ................. 438/122

FOREIGN PATENT DOCUMENTS

JP        A-7-321246       12/1995

* cited by examiner

Primary Examiner—W. David Coleman
(74) Attorney, Agent, or Firm—Paul & Paul

(57) ABSTRACT

A heat spreader adapted to be insert-molded with resin on a surface of a circuit board on which a semiconductor chip is mounted so that the heat spreader covers the surface of the circuit board including an upper surface of the semiconductor chip over substantially a same area as that covered with molded resin when insert-molded with resin. The heat spreader has a main-portion which defines a larger gap with respect to the surface of the circuit board when insert-molded with resin and a sub-portion which defines a smaller gap with respect to the surface of the circuit board when insert-molded with resin. The sub-portion is embedded in the mold resin when insert-molded with resin so that the heat spreader is strongly adhered to the resin.

11 Claims, 5 Drawing Sheets

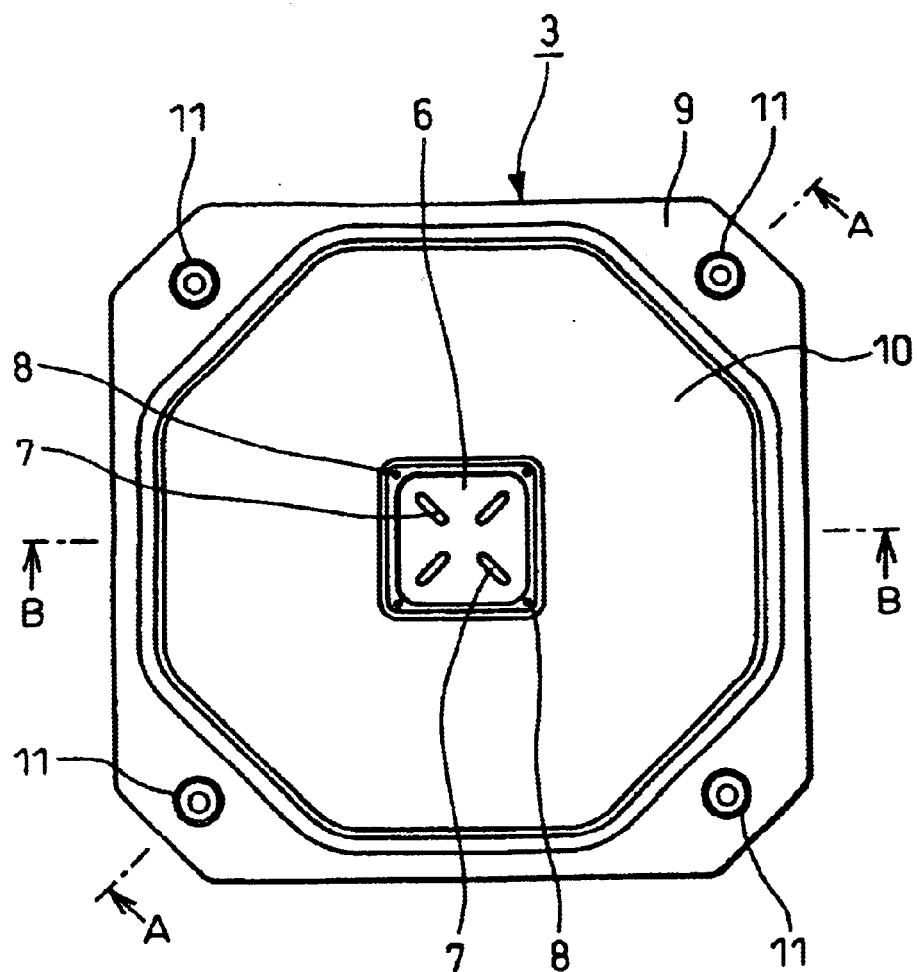

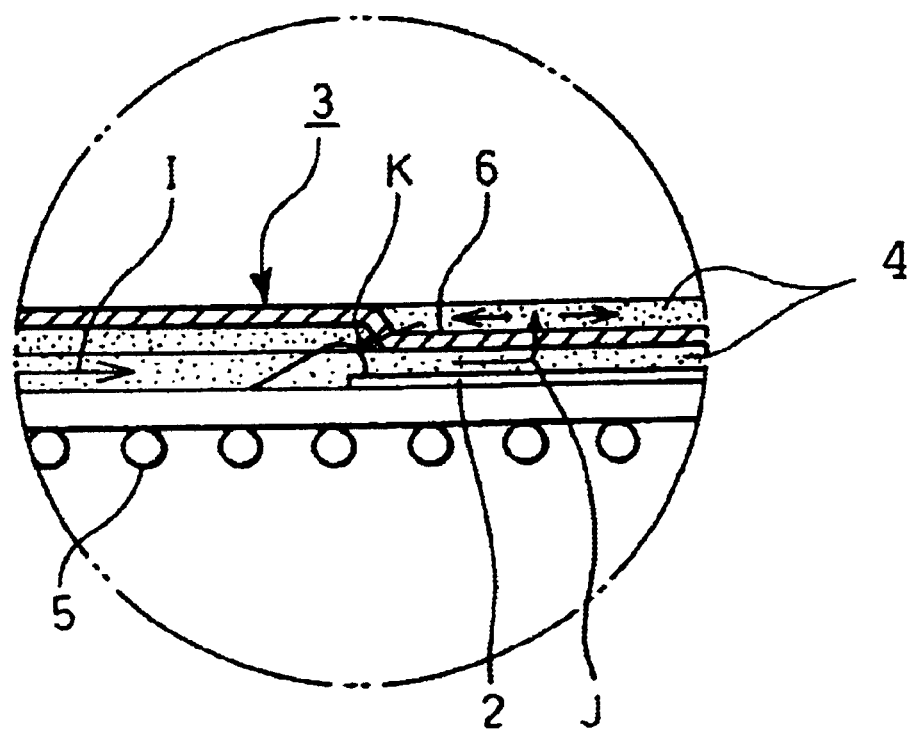

INSERT-MOLDABLE HEAT SPREADER, SEMICONDUCTOR DEVICE USING SAME, AND METHOD FOR MANUFACTURING SUCH SEMICONDUCTOR DEVICE

BACKGROUND OF THE INVENTION

1. Field of the Invention

The present invention relates to a heat spreader formed to be insert-moldable so that part thereof is embedded in mold resin, and a semiconductor device in which a semiconductor chip mounted onto a circuit board is insert-molded with mold resin together with the above-mentioned heat spreader. This invention also relates to a method for manufacturing such a semiconductor device.

2. Description of the Related Art

A semiconductor device of a molded BGA (ball grid array) type is formed in such a manner that a semiconductor chip is mounted onto one surface of a single- or multiple-layered circuit board on which circuit patterns are formed, and is electrically connected to the circuit patterns, after which the circuit board is set in a mold to shield the semiconductor chip with mold resin. Then, solder balls are placed on lands formed on the opposite surface of the circuit board, and bonded thereto by reflow.

Recently, the working frequency of a microprocessor unit (MPU) mounted onto an electronic equipment such as a personal computer has become higher whereby a large amount of heat is generated from a semiconductor chip and a chip set in the vicinity thereof. To enhance the heat dissipation from the semiconductor device, one semiconductor device has been proposed which is produced by the insert-molding of a so-called mold-insertion type heat spreader with mold resin. More concretely, the heat spreader is preliminarily placed within a cavity of a mold, and a circuit board on which a semiconductor chip is mounted is placed in the cavity, after which the mold is clamped and shielded with resin. Thereby, a semiconductor device in which the heat spreader is molded while being exposed outside a package part is obtained. The semiconductor device in which the heat spreader is insert-molded with mold resin is disclosed, for example, in Japanese Unexamined Patent Publication (Kokai) No. 7-321246 or U.S. Pat. No. 5,216,278.

To enhance the heat dissipation, the mold-insertion type heat spreader covers a top surface of the semiconductor chip, and it is necessary that an area or volume occupied by the package part is larger. Also, to facilitate the reliability of the semiconductor device, it is necessary to bring the heat spreader into tight contact with the semiconductor chip. Otherwise, to enhance the mold quality and the productivity, it is necessary to improve the pouring efficiency of mold resin. That is, since the package part is thin, the mold resin must shield a relatively wide area through a narrow space between the circuit board and the heat spreader. If voids generate due to the involvement of air or the fluidity of mold resin is unfavorable, there may be a problem in that the mold resin solidifies before it is sufficiently spread throughout the package.

Further, it is desirable that the heat spreader can be easily assembled and is good-looking when being exposed out of the resin-molded package as well as allowing the semiconductor device to be produced at a lower cost.

SUMMARY OF THE INVENTION

An object of the present invention is to solve the above-mentioned problems in the prior art and to provide a heat spreader improved in the heat dissipation and close adherence with the mold resin as well as being excellent in pouring efficiency of the mold resin, and a semiconductor device having a high reliability and high productivity incorporating such a heat spreader.

According to the present invention, there is provided a heat spreader adapted to be insert-molded with resin on a surface of a circuit board on which a semiconductor chip is mounted so that said heat spreader covers said surface of the circuit board including an upper surface of said semiconductor chip over substantially a same area as that covered with molded resin when insert-molded with resin, said heat spreader having: a first, main portion which defines a first gap with respect to said surface of the circuit board when insert-molded with resin; and a second portion which defines a second gap with respect to said surface of the circuit board when insert-molded with resin, said second gap being smaller than said first gap, so that at least said second portion is embedded in said mold resin when insert-molded with resin.

According to another aspect of the present invention, there is provided a heat spreader adapted to be insert-molded with resin on a surface of a circuit board on which a semiconductor chip is mounted so that said heat spreader covers said surface of the circuit board including an upper surface of said semiconductor chip over substantially a same area as that covered with molded resin when insert-molded with resin, said heat spreader comprising: a first (lower) surface positioned at a side of said circuit board and adhered with resin when insert-molded with resin; and a second (upper) surface positioned opposite to said first surface and at least a part thereof defining an exposed surface when insert-molded with resin;

said heat spreader further comprising: a first part, at the first surface thereof, defining a first gap with respect to said surface of the circuit board when insert-molded with resin and, at the second surface thereof, defining said exposed surface when insert-molded with resin; and a second part, at the first surface thereof, defining a second gap with respect to said surface of the circuit board when insert-molded with resin, said second gap being smaller than said first gap and, at the second surface thereof, being adhered to and embedded in resin when insert-molded with resin.

The heat spreader further comprises a plurality of third parts (legs), at the first surface thereof, which are in contact with said surface of the circuit board when insert-molded with resin. The third parts are provided on said second part.

The heat spreader further comprises, in a plan view thereof in parallel to said surface of the circuit board when insert-molded with resin: a central region recessed toward said surface of the circuit board to define a recessed portion constituting at least a part of said second part; and said recessed portion comprising a bottom portion provided with at least one resin hole through which resin flows when insert-molding and a peripheral portion provided with at least one ventilation hole through which air is ventilated when insert-molding; and said recessed portion, at the second surface thereof, being adhered to and embedded in resin when insert-molded with resin.

The heat spreader comprises, in a plan view thereof in parallel to said surface of the circuit board when insert-molded with resin: an outer peripheral region stepped toward said surface of the circuit board to constitutes at least a part of said second part along all over an outer periphery thereof; and said outer peripheral region, at the second surface thereof, being adhered to and embedded in resin when insert-molded with resin.

Otherwise, the heat spreader comprises, in a plan view thereof in parallel to said surface of the circuit board when insert-molded with resin: a central region recessed toward said surface of the circuit board to define a recessed portion constituting at least a part of said second part, and said recessed portion comprising a bottom portion provided with at least one resin hole through which resin flows when insert-molding and a peripheral portion provided with at least one ventilation hole through which air is ventilated when insert-molding; and said recessed portion, at the second surface thereof, being adhered to and embedded in resin when insert-molded with resin; an outer peripheral region stepped toward said surface of the circuit board to constitutes at least a part of said second part along all over an outer periphery thereof; and said outer peripheral region, at the second surface thereof, being adhered to and embedded in resin when insert-molded with resin; and an intermediate region between said central region and said peripheral region, at the second surface thereof, defining an exposed surface when insert-molded with resin.

The heat spreader further comprises, when insert-molding with resin: means for defining a first cavity between said first surface of this heat spreader and said surface of the circuit board and means for defining a second cavity between said second surface of this heat spreader and an insert mold frame which is in contact with said first part, at the second surface thereof, and with a peripheral edge of said heat spreader; and both said first and second cavities being filled with resin when insert molded, and a volume of said first cavity is larger than a total volume of said second cavity.

According to still another aspect of the present invention, there is provided a semiconductor device comprising: a circuit board having a surface; a semiconductor chip mounted on said surface of the circuit board; and a heat spreader having a first, main portion which defines a first gap to said surface of the circuit board, and a second portion which defines a second gap to said surface of the circuit board, said second gap being smaller than said first gap; and a resin insert-molded with said heat spreader integrally on said surface of the circuit board so as to cover an area of said surface including an upper surface of said semiconductor chip, so that at least said second portion is embedded in said resin.

According to a further aspect of the present invention, there is provided a semiconductor device comprising: a circuit board having a surface; a semiconductor chip mounted on said surface of the circuit board; and a heat spreader insert-molded with resin on a surface of a circuit board so that said heat spreader covers said surface of the circuit board including an upper surface of said semiconductor chip over substantially a same area as that covered with molded resin;

said heat spreader comprising: a first (lower) surface positioned at a side of said circuit board and adhered with resin; and a second (upper) surface positioned opposite to said first surface and at least a part thereof defining an exposed surface;

said heat spreader further comprising: a first part, at the first surface thereof, defining a first gap with respect to said surface of the circuit board and, at the second surface thereof, defining said exposed surface; and a second part, at the first surface thereof, defining a second gap with respect to said surface of the circuit board, said second gap being smaller than said first gap and, at the second surface thereof, being adhered to and embedded in resin; and said resin insert-molded with said heat spreader integrally on said surface of the circuit board so as to cover an area of said surface including an upper surface of said semiconductor chip, so that said second part of the heat spreader, at the first surface thereof, is adhered to and embedded in said resin.

According to still further aspect of the present invention there is provided a method for manufacturing a semiconductor device; said device comprising a semiconductor chip mounted on said surface of the circuit board; and a heat spreader insert-molded with resin on a surface of a circuit board so that said heat spreader covers said surface of the circuit board including an upper surface of said semiconductor chip over substantially a same area as that covered with molded resin, said heat spreader comprising: a first surface positioned at a side of said circuit board and adhered with resin; and a second surface positioned opposite to said first surface and at least a part thereof defining an exposed surface; and said heat spreader further comprising: a first part, at the first surface thereof, defining a first gap with respect to said surface of the circuit board and, at the second surface thereof, defining said exposed surface; and a second part, at the first surface thereof, defining a second gap with respect to said surface of the circuit board, said second gap being smaller than said first gap and, at the second surface thereof, being adhered to and embedded in resin:

said method comprising:

setting a molding component to define a mold cavity comprising a first cavity between said first surface of this heat spreader and said surface of the circuit board and a second cavity between said second surface of this heat spreader and said components, so that at least a part of said molding components is in contact with said first part, at the second surface thereof, and at least a remaining part of said molding component is in contact with a peripheral edge of said heat spreader; and injecting resin simultaneously into both said first and second cavities so that both said first and second cavities are filled with resin.

BRIEF DESCRIPTION OF THE DRAWINGS

FIG. 1 is a plan view of a heat spreader of this invention;

FIG. 4(c) is an enlarged view of part L in FIG. 4(b).

DETAILED DESCRIPTION OF THE PREFERRED EMBODIMENTS

Figure 2A:
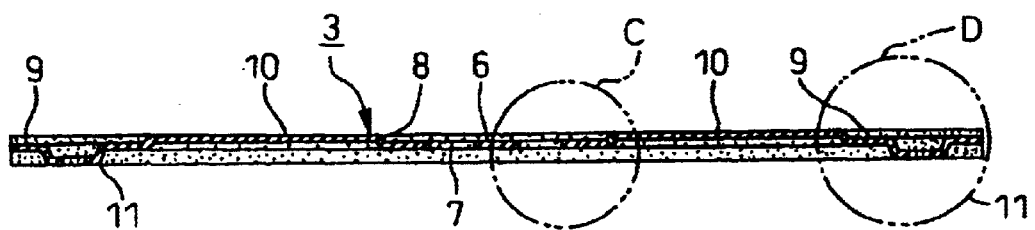
FIG. 2(a) is a sectional view taken along an arrow line A—A in FIG. 1.

The preferred embodiment of the present invention will be described in more detail below with reference to the attached drawings. In this embodiment, the description is made when a semiconductor chip is surface-mounted to a semiconductor device by a wire bonding method.

First, a general structure of the semiconductor device will be explained with reference to FIG. 4(b). Reference numeral 1 denotes a circuit board, and in this embodiment, a printed circuit board is used. This circuit board 1 may be either a single-layered circuit board having one circuit layer or a multi-layered circuit board having a plurality of circuit layers. In a central area of one surface of the circuit board, a semiconductor chip 2 is mounted. An electrode section of this semiconductor chip 2 and a chip pad of the circuit board 1 are wire-bonded to be electrically connected with each other. Reference numeral 3 denotes a heat spreader insert-molded with mold resin 4 together with the semiconductor chip 2 mounted to the circuit board 1. The heat spreader 3 is insert-molded so that it covers an area substantially equal to that covered with the mold resin on the circuit board 1 including a top surface of the semiconductor chip 2 mounted to the circuit board 1, and an area of the heat spreader exposed out of the mold resin is as large as possible while a part thereof is embedded in the mold resin 4. Reference numeral 5 denotes solder balls forming connection terminals of the circuit board and connected with lands provided on the other surface of the circuit board.

Next, a structure of the heat spreader 3 will be explained with reference to FIGS. 1 to 3.

In FIG. 1, the heat spreader 3 is formed of a metallic sheet such as copper or copper alloy preferably through press-forming or drawing rather than a forging by taking a thermal characteristic thereof into account. In a central area of the heat spreader 3, a recessed section 6 bulged toward the circuit board 1 is formed by a drawing to have a predetermined depth. This recessed section 6 is embedded into the mold resin 4 for enhancing the contact tightness with the package and disposed close to the semiconductor chip 2 for facilitating the heat dissipation (see FIG. 3(b)). Also, in the recessed section 6, four resin holes 7 are diagonally provided in the bottom wall for allowing the mold resin 4 to pass through the same and four ventilation holes 8 are diagonally provided in the peripheral wall (see FIG. 2(b)). As described later, the recessed section 6 is filled with the mold resin 4 supplied from the lower side through the resin holes 7, and air in the recessed section 6 is discharged out through the ventilation holes 8 to the lower side of the heat spreader 3. The depth (that is, a height from the circuit board) of the recessed section 6 may be optionally designed in accordance with kinds of the semiconductor chip 2 or the mold resin. Also, the recessed section 6 may be disposed as close as possible to the semiconductor chip unless it interferes with bonding wires connected to the semiconductor chip 2. For example, when the semiconductor chip is mounted in a flip-chip manner, the recessed section may be disposed to be in contact with a top surface of the semiconductor chip.

The heat spreader 3 is formed by chamfering corners of a rectangular metallic sheet, and a height of an outer periphery 9 thereof from the circuit board 1 is designed so that more of the mold resin is poured from a gate of a mold on the lower side of the heat spreader 3 than from the upper side. The height of the outer periphery 9 may be optionally designed in accordance with kinds of the semiconductor chip 2 or the mold resin (see FIG. 4(b)).

Figure 2B:
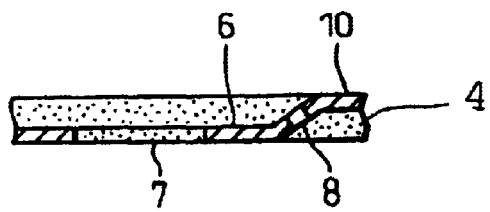
FIGS. 2(b) and 2(c) are enlarged views of parts C and D, respectively, in FIG. 2(a)
Figure 3A:
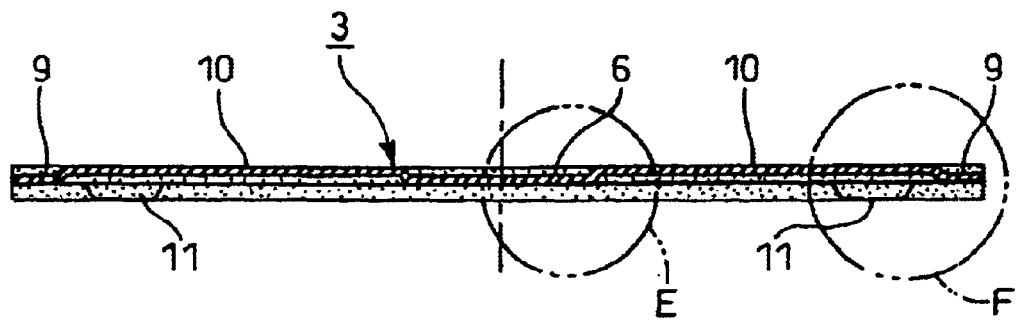
FIG. 3(a) is a sectional view taken along an arrow line B—B in FIG. 1.
Figure 3B:
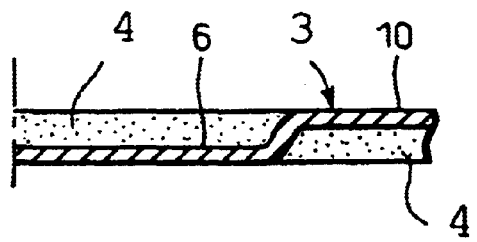
FIGS. 3(b) and 3(c) are enlarged views of parts E and F, respectively, in FIG. 3(a)

As shown in FIGS. 2(a) and 3(a), an exposed portion 10 formed between the recessed section 6 and the outer periphery 9 of the heat spreader 3 is protrudes more than the outer periphery 9 and has a polygonal shape (in this embodiment, an octagonal shape). The mold resin 4 poured from the gate of the mold flows along the outer periphery 9 while being separated into an upper side and a lower side of the heat spreader 3. At this time, the mold resin 4 poured on the upper side impinges onto one side of the octagonal exposed portion 10 and flows around the outer periphery 9 to be guided to an opposite position (a position Y opposite to a position X of the gate in relation to the recessed section 6).

Figure 2C:
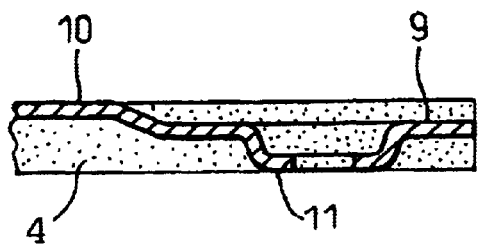
Figure 3C:
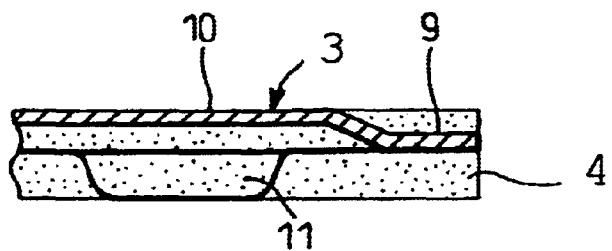

In the vicinity of the outer periphery 9 of the heat spreader 3, four legs 11 are formed for locating the heat spreader relative to the circuit board 1 in the mold (see FIGS. 2(c) and 3(c)). The leg 11 is formed by drawing to protrude downward so that the leg 11 is in contact with the surface of the circuit board placed in the mold cavity when the heat spreader 3 is placed in the mold cavity in a reverse state. Thereby, when the mold resin 4 is filled in the cavity, the heat spreader 3 is prevented from floating up to allow the mold resin to enter a region of the exposed portion 10.

Figure 4A:
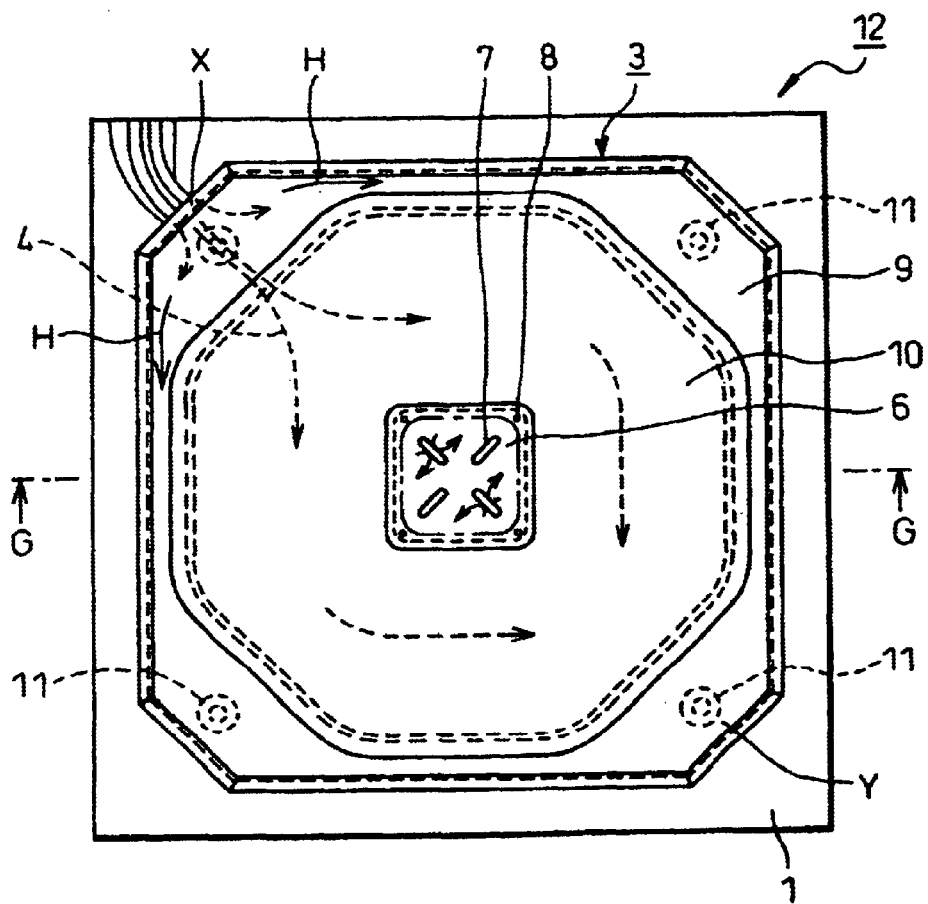
FIG. 4(a) is a view illustrating a flow of mold resin in a semiconductor device.
Figure 4B:
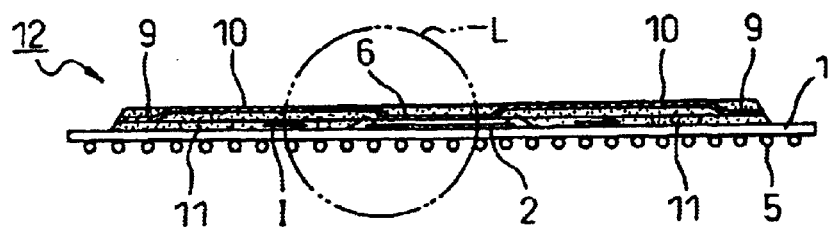
FIG. 4(b) is a sectional view taken along an arrow line G—G in FIG. 4(a)

Next, the steps will be explained for assembling the heat spreader 3 to semiconductor device by an insert-molding method with reference to FIGS. 4(a) to 4(c) illustrating the flow of the mold resin 4. The heat spreader 3 with the exposed portion 10 facing downward is placed in advance on the bottom of the cavity of a mold (a lower mold) not shown, and then the circuit board 1 carrying the semiconductor chip 2 thereon is accommodated within the cavity. The mold is clamped in this state and the mold resin 4 is filled in the cavity through a runner gate.

In FIG. 4(a), the mold resin 4 is poured into the cavity while being divided, in the gate of the mold, into an upper side (second cavity) and a lower side (first cavity) of the outer periphery 9 of the circuit board 1. As described above, the height of the outer periphery 9 from the circuit board is designed so that the amount of the mold resin 4 is greater on the lower side than on the upper side of the heat spreader 3. This is because it is desirable that air does not dwell between the circuit board 1 and the heat spreader 3 for the purpose of assuredly shielding the periphery of the semiconductor chip 2 and, therefore, that the mold resin 4 flowing to the upper side of the outer periphery 9 is prevented from reaching the position Y opposite to the position X of the gate in relation to the recessed section 6 prior to the arrival of the mold resin 4 flowing the lower side.

The mold resin poured on the upper side of the outer periphery 9 impinges onto one side of the octagonal exposed portion 10 and flows around the exposed portion 10 in the direction of arrow H along a generally semicircular path to fill a region reaching the position Y opposite to the position X of the gate in relation to the recessed section 6 (see FIG. 4(a)).

The mold resin poured on the upper side of the outer periphery 9 flows through a space between the circuit board 1 and the heat spreader 3 in the direction of arrow I as shown in FIG. 4(b), and passes via a space between the semiconductor chip 2 and the recessed section 6 through the resin holes 7 from bottom to top in the direction of arrow J to fill the recessed section 6. At this time, air within the recessed section 6 is discharged through the ventilation holes 8 in the direction of arrow K and pushed out from the space between the circuit board 1 and the heat spreader 3 by the mold resin 4 in the direction of arrow I. In FIG. 4(a), after the mold resin 4 flowing on the lower side of the heat spreader 3 has been filled to the position Y opposite to the position X of the gate in relation to the recessed section 6, the mold resin 4 flowing on the upper side is filled to the opposite position Y.

When the mold resin 4 in the package portion is solidified within the mold, the mold is opened to remove the circuit board 1 therefrom. The solder balls 5 are mounted to the pad section formed on the other surface of the circuit board 1, and bonded to the latter by the reflow, whereby the semiconductor device 12 is produced.

Since the above-mentioned heat spreader 3 covers an area substantially the same as the molded portion on the circuit board 1 including the top surface of the semiconductor chip 2 mounted onto the circuit board 1 while maintaining the exposed portion 10 of the heat spreader as large as possible and insert-molding the remaining part of the heat spreader within the mold resin 4 to be embedded therein, it is possible to enhance the contact tightness of the mold resin as well as facilitate the heat dissipation of the semiconductor device 12.

Also, by denting the recessed section 6 of the heat spreader 3 toward the circuit board 1 at a predetermined depth (a predetermined height above the circuit board), it is possible to adjust a gap between the recessed section 6 and the semiconductor chip 2 in accordance with kinds of semiconductor chip 2 or mold resin.

Also, since the recessed section 6 is embedded into the mold resin 4 during the insert-molding, the recessed section 6 acts as a wedge for enhancing the attachment thereof, whereby the contact tightness of the mold resin the heat spreader 3 and the reliability of the semiconductor device 12 are improved.

Since the legs 11 are formed on the outer periphery 9 of the heat spreader 3 for positioning the latter on the circuit board 1, and a height of the outer periphery 9 above the circuit board is designed so that the amount of the mold resin 4 poured from the gate of the mold is greater on the lower side of the heat spreader 3 than on the upper side, it is possible to enhance the pouring efficiency of the mold resin 4 by suitably adjusting the height of the outer periphery 9 above the circuit board.

Also, since the exposed portion 10 of the heat spreader 3 is designed to be higher than the outer periphery 9 and the mold resin 4 poured from the gate of the mold onto the outer periphery 9 is guided to an area opposite to the gate, it is possible to prevent air from dwelling between the circuit board 1 and the heat spreader 3, whereby the periphery of the semiconductor chip 2 is securely shielded with resin and the reliability of the semiconductor device 12 is improved.

The present invention has been described in detail above with reference to the preferred embodiments. The present invention, however, should not be limited to these embodiments. For example, the heat spreader 3 may be made of any other material, or the outer shape of the exposed portion 10 should not be limited to the polygon but may be formed of a curved line, such as a circle or an oval. While the semiconductor chip is wire-bonded to the circuit board in the above embodiments, a flip-chip connection may be adopted. Also, the present invention may be applicable not only to a single-layered circuit board but also to a multi-layered circuit board. That is, various changes and modifications are possible without departing from the spirit of the present invention.

What is claimed is:

1. A heat spreader adapted to be insert-molded with resin on a surface of a circuit board on which a semiconductor chip is mounted so that said heat spreader covers said surface of the circuit board including an upper surface of said semiconductor chip over substantially a same area as that covered with molded resin when insert-molded with resin, said heat spreader comprising:

a first surface positioned at a side of said circuit board and adhered with resin when insert-molded with resin; and a second surface positioned opposite to said first surface and at least a part thereof defining an exposed surface when insert-molded with resin;

said heat spreader further comprising:

a first part, at the first surface thereof, defining a first gap with respect to said surface of the circuit board when insert-molded with resin and at the second surface thereof, defining said exposed surface when insert-molded with resin; and a second part, at the first surface thereof, defining a second gap with respect to said surface of the circuit board when insert-molded with resin, said second gap being smaller than said first gap and, at the second surface thereof, being adhered to and embedded in resin when insert-molded with resin, wherein said third parts are provided on said second part, further comprising, in a plan view thereof in parallel to said surface of the circuit board when insert-molded with resin:

a central region recessed toward said surface of the circuit board to define a recessed portion constituting at least a part of said second part; and said recessed portion comprising a bottom portion provided with at least one resin hole through which resin flows when insert-molding and a peripheral portion provided with at least one ventilation hole through which air is ventilated when insert-molding; and said recessed portion, at the second surface thereof, being adhered to and embedded in resin when insert-molded with resin.

2. A heat spreader adapted to be insert-molded with resin on a surface of a circuit board on which a semiconductor chip is mounted so that said heat spreader covers said surface of the circuit board including an upper surface of said semiconductor ship over substantially a same area as that covered with molded resin when insert-molded with resin, said heat spreader having:

a first, main portion which defines a first gap with respect to said surface of the circuit board when insert-molded with resin; and a second portion which defines a second gap with respect to said surface of the circuit board when insert-molded with resin, said second gap being smaller than said first gap, so that at least said second portion is embedded in said mold resin when insert-molded with resin, wherein said third portions are provided on said second portions, further comprising, in a plan view thereof in parallel to said surface of the circuit board when insert-molded with resin:

an outer peripheral region stepped toward said surface of the circuit board to constitute at least a part of said second part along an outer periphery thereof; and said outer peripheral region, at the second surface thereof, being adhered to and embedded in resin when insert-molded with resin.

3. A heat spreader adapted to be insert-molded with resin on a surface of a circuit board on which a semiconductor chip is mounted so that said heat spreader covers said surface of the circuit board including an upper surface of said semiconductor ship over substantially a same area as that covered with molded resin when insert-molded with resin, said heat spreader having:

a first, main portion which defines a first gap with respect to said surface of the circuit board when insert-molded with resin; and a second portion which defines a second gap with respect to said surface of the circuit board when insert-molded with resin, said second gap being smaller than said first gap, so that at least said second portion is embedded in said mold resin when insert-molded with resin, wherein said third portions are provided on said second portions, further comprising, in a plan view thereof in parallel to said surface of the circuit board when insert-molded with resin:

a central region recessed toward said surface of the circuit board to define a recessed portion constituting at least a part of said second part, and said recessed portion comprising a bottom portion provided with at least one resin hole through which resin flows when insert-molding and a peripheral portion provided with at least one ventilation hole through which air is ventilated when insert-molding; and said recessed portion, at the second surface thereof, being adhere to and embedded in resin when insert-molded with resin;

an outer peripheral region stepped toward said surface of the circuit board to constitute at least a part of said second part along an outer periphery thereof; and said outer peripheral region at the second surface thereof, being adhered to and embedded in resin when insert-molded with resin; and an intermediate region between said central region and said peripheral region, at the second surface thereof, defining an exposed surface when insert-molded with resin.

4. A heat spreader as set forth in claim 3 further comprising, when insert-molding with resin:

means for defining a first cavity between said first surface of this heat spreader and said surface of the circuit board and means for defining a second cavity between said second surface of this heat spreader and an insert mold frame which is in contact with said first part, at the second surface thereof, and with a peripheral edge of said heat spreader; and both said first and second cavities being filled with resin when insert molded, and a volume of said first cavity being larger than a total volume of said second cavity.

5. A semiconductor device comprising:

a circuit board having a surface;

a semiconductor chip mounted on said surface of the circuit board; and a heat spreader insert-molded with resin on a surface of a circuit board so that said heat spreader covers said surface of the circuit board including an upper surface of said semiconductor chip over substantially a same area as that covered with molded resin;

said heat spreader comprising:

a first surface positioned at a side of said circuit board and adhered with resin; and a second surface positioned opposite to said first surface and at least a part thereof defining an exposed surface;

said heat spreader further comprising:

a first part, at the first surface thereof, defining a first gap with respect to said surface of the circuit board and, at the second surface thereof, defining said exposed surface; and a second part, at the first surface thereof, defining a second gap with respect to said surface of the circuit board, said second gap being smaller than said first gap and, at the second surface thereof, being adhered to and embedded in resin; and said resin insert-molded with said heat spreader integrally on said surface of the circuit board so as to cover an area of said surface including an upper surface of said semiconductor chip, so that said second part of the heat spreader, at the first surface thereof, is adhered to and embedded in said resin.

6. A semiconductor device as set forth in claim 5, wherein said heat spreader further comprises a plurality of third parts, at the first surface thereof which are in contact with said surface of the circuit board.

7. A semiconductor device as set forth in claim 5, wherein said third parts are provided on said second part.

8. A semiconductor device as set forth in claim 5, wherein said heat spreader further comprises, in a plan view thereof in parallel to said surface of the circuit board:

a central region recessed toward said surface of the circuit board to define a recessed portion constituting a least a part of said second part; and said recessed portion comprising a bottom portion provided with at least one resin hole through which resin flows when insert-molding and a peripheral portion provided with at least one ventilation hole through which air is ventilated when insert-molding; and said recessed portion, at the second surface thereof, being adhered to and embedded in resin.

9. A semiconductor device as set forth in claim 5, wherein said heat spreader further comprises, in a plan view thereof in parallel to said surface of the circuit board:

an outer peripheral region stepped toward said surface of the circuit board to constitutes at least a part of said second part along an outer periphery of the heat spreader; and said outer peripheral region, at the second surface thereof, being adhered to and embedded in resin.

10. A semiconductor device as set forth in claim 5, wherein said heat spreader further comprises, in a plan view thereof in parallel to said surface of the circuit board:

a central region recessed toward said surface of the circuit board to define a recessed portion constituting at least a part of said second part, and said recessed portion comprising a bottom portion provided with at least one resin hole through which resin flows when insert-molding and a peripheral portion provided with at least one ventilation hole through which air is ventilated when insert-molding; and said recessed portion, at the second surface thereof, being adhered to and embedded in resin;

an outer peripheral region stepped toward said surface of the circuit board to constitute at least a part of said second part along an outer periphery of the heat spreader; and said outer peripheral region, at the second surface thereof, being adhered to and embedded in resin; and an intermediate region between said central region and said peripheral region, at the second surface thereof, defining an exposed surface.

11. A semiconductor device as set forth in claim 5, wherein said heat spreader further comprises, when insert-molding with resin:

means for defining a first cavity between said first surface of this heat spreader and said surface of the circuit and means for defining a second cavity between said second surface of this heat spreader and an insert mold frame which is in contact with said first part, at the second surface thereof, and with a peripheral edge of said heat spreader; and both said first and second spaces being filled with resin, and a volume of said first cavity is larger than a total volume of said second cavity.

* * * * *